US007288430B2

(12) United States Patent
Faure et al.

(10) Patent No.: US 7,288,430 B2
(45) Date of Patent: *Oct. 30, 2007

(54) METHOD OF FABRICATING HETEROEPITAXIAL MICROSTRUCTURES

(75) Inventors: Bruce Faure, Grenoble (FR); Fabrice Letertre, Grenoble (FR); Bruno Ghyselen, Seyssinet-Pariset (FR)

(73) Assignee: S.O.I.Tec Silicon on Insulator Technolgoies, Bernin (FR)

( * ) Notice: Subject to any disclaimer, the term of this patent is extended or adjusted under 35 U.S.C. 154(b) by 201 days.

This patent is subject to a terminal disclaimer.

(21) Appl. No.: 11/165,895

(22) Filed: Jun. 24, 2005

(65) Prior Publication Data

US 2005/0266626 A1   Dec. 1, 2005

Related U.S. Application Data

(63) Continuation of application No. 10/922,997, filed on Aug. 23, 2004, and a continuation-in-part of application No. 10/700,899, filed on Nov. 3, 2003, now Pat. No. 6,946,317, which is a continuation of application No. 10/446,605, filed on May 27, 2003, now Pat. No. 6,794,276, which is a continuation of application No. PCT/FR01/03714, filed on Nov. 26, 2001.

(30) Foreign Application Priority Data

Nov. 27, 2000  (FR) ................. 00 15279
May 27, 2003  (EP) ................. 03291284

(51) Int. Cl.
  *H01L 21/00* (2006.01)
(52) U.S. Cl. ............... 438/94; 439/47; 439/191; 439/311; 257/E21.085; 257/E21.092; 257/E21.097; 257/E21.102; 257/E21.108; 257/E21.082; 257/E21.115; 257/E21.117

(58) Field of Classification Search ................ 438/94, 438/99, 311, 105, 191, 602, 604, 605, 606, 438/607, 663, 689, 692, 712, 715, 752, 753, 438/933
See application file for complete search history.

(56) References Cited

U.S. PATENT DOCUMENTS 4,011,580 A   3/1977   Kasperkovitz ............. 257/542

(Continued)

FOREIGN PATENT DOCUMENTS

DE     197 53 494 A1    3/1997

(Continued)

OTHER PUBLICATIONS

K. Hiramatsu et al., "Growth mechanism of GaN growth on sapphire with AIN buffer layer by MOVPE", Elsevier Science, Journal of Crystal Growth, vol. 115 pp. 628-633 (1991).

(Continued)

*Primary Examiner*—David Nhu
(74) *Attorney, Agent, or Firm*—Winston & Strawn LLP

(57) ABSTRACT

An efficient method of fabricating a high-quality heteroepitaxial microstructure having a smooth surface. The method includes detaching a layer from a base structure to provide a carrier substrate having a detached surface, and then forming a heteroepitaxial microstructure on the detached surface of the carrier substrate by depositing an epitaxial layer on the detached surface of a carrier substrate. Also included is a heteroepitaxial microstructure fabricated from such method.

13 Claims, 2 Drawing Sheets

U.S. PATENT DOCUMENTS

| | | | |
|---|---|---|---|
| 5,374,564 A | 12/1994 | Bruel | 437/24 |
| 5,977,697 A | 11/1999 | Jin et al. | 313/310 |
| 6,114,188 A | 9/2000 | Oliver et al. | 438/107 |
| 6,117,700 A | 9/2000 | Orita et al. | 438/46 |
| 6,251,754 B1* | 6/2001 | Ohshima et al. | 438/506 |
| 6,284,629 B1* | 9/2001 | Yokokawa et al. | 438/459 |
| 6,303,468 B1 | 10/2001 | Aspar et al. | 438/455 |
| 6,328,796 B1 | 12/2001 | Kub et al. | 117/94 |
| 6,679,947 B2 | 1/2004 | Koike et al. | 117/97 |
| 6,794,276 B2 | 9/2004 | Letertre et al. | 438/506 |
| 6,869,806 B2 | 3/2005 | Cui et al. | 438/3 |
| 6,946,317 B2* | 9/2005 | Faure et al. | 438/94 |
| 2002/0072130 A1 | 6/2002 | Cheng et al. | 438/10 |

FOREIGN PATENT DOCUMENTS

| | | |
|---|---|---|
| EP | 0971 395 A1 | 1/2000 |
| FR | 2 681 472 A1 | 3/1993 |
| FR | 2797 713 A1 | 8/1999 |
| FR | 2 787 919 A1 | 6/2000 |
| FR | 2 830 983 | 10/2001 |
| JP | 05-211128 | 8/1993 |
| JP | 10-012547 | 1/1998 |
| JP | 2000-030995 | 1/2000 |
| WO | WO 00/44966 A1 | 8/2000 |
| WO | WO 01/22482 A1 | 3/2001 |
| WO | WO 02/43112 A2 | 5/2002 |

OTHER PUBLICATIONS

L. Liu et al., "Substrates for gallium nitride epitaxy", Elsevier Science, Materials Science and Engineering R 37, pp. 61-127 (2002).

Hobart et al., "Transfer of Ultrathin Silicon Layers to Polycrystalline SiC Substrates for the Growth of 3C-SiC Epitaxial Films", Journal of the Electrochemical Society, vol. 146, No. 10, pp. 3833-3836 (1999).

* cited by examiner

METHOD OF FABRICATING HETEROEPITAXIAL MICROSTRUCTURES

CROSS-REFERENCE TO RELATED APPLICATIONS

This application is a continuation of application Ser. No. 10/700,899 filed Nov. 3, 2003 U.S. Pat. No. 6,946,317, and a continuation-in-part of copending application 10/922,997 filed Aug. 23, 2004 which is a continuation of application 10/446,605 filed May 27, 2003, now U.S. Pat. No. 6,794,276, which in turn is a continuation of International application PCT/FR01/03714 filed Nov. 26, 2001, the entire content of each of which is expressly incorporated herein by reference thereto.

FIELD OF INVENTION

The present invention relates to an efficient and cost effective method of fabricating a microstructure. The method includes detaching a carrier structure to provide a base substrate having a detached surface, and depositing an epitaxial layer on the detached surface of the base substrate. The present invention also relates to the microstructure formed from such method.

BACKGROUND

Generally, it is known that crystalline microstructures may be fabricated by forming an epitaxial gallium nitride layer on an $\alpha$-$Al_2O_3$ substrate. Typically, such microstructures include a buffer layer such as aluminum nitride between the gallium nitride and the $\alpha$-$Al_2O_3$ so that the lattice constant mismatch between the gallium nitride layer and the $\alpha$-$Al_2O_3$ substrate materials is reduced.

It is also known that crystalline microstructures may be fabricated without buffer layers when the gallium nitride layer epitaxial layer is formed on a base substrate of silicon carbide, silicon or another material that is compatible with the gallium nitride epitaxy.

Additionally, the formation of SiGe layers by epitaxial growth on flat surfaces is also known.

In order to produce crystalline microstructures that have a deposited epitaxial layer with good crystal quality, the base substrate or carrier must have a smoothly finished surface. Thus, it has been necessary to polish such surfaces to obtain a base substrate having very low surface roughness. The polishing steps necessary to achieve smoothly finished base substrates are time-consuming, costly, and have low efficiency. Moreover, such polishing steps are particularly difficult when materials such as SiC are to be polished. Silicon carbide and other similar materials can only be polished with a very low efficiency due to their thinness and hardness qualities. Thus, such materials are typically provided having an increased surface roughness and defects such as surface scratches. These drawbacks have lead those skilled in the art to the opinion that SiC substrates are not suitable for fabricating high quality heteroepitaxial structures, such as structures with a gallium nitride layer.

Thus, there is a need for a more efficient method for fabricating a microstructure, especially a heteroepitaxial microstructure, with high crystal quality and a high degree of surface smoothness, and to provide a high quality microstructure with a smooth surface which can be fabricated efficiently.

SUMMARY OF INVENTION

The present invention satisfies that need by providing an efficient method for fabricating a microstructure comprising the steps of detaching a layer from a base structure to provide a carrier substrate having a detached surface, and forming a microstructure on the detached surface of the carrier substrate by depositing a first epitaxial layer thereon. It has surprisingly been found that a base substrate formed in this way has very smooth detached surface and is especially well-suited for forming an epitaxial layer with a high crystal quality and an excellent level of smoothness.

Advantageously, the microstructure formed from a base substrate having a detached surface and a deposited epitaxial layer is fabricated with less time and effort typically required for fabricating the microstructure of the prior art. Additionally, if desired, the detached surface may be treated or further polished.

In one embodiment of the invention, the detaching process for detaching the carrier surface to provide the base substrate is includes the implantation of species into the carrier structure, and subjecting the implanted structure to thermal annealing. The species include for illustration and not limitation, hydrogen ions, and rare gases. Advantageously, the characteristics of the detached carrier surface can be controlled by adjusting the parameters of the detaching process, such as the implantation dose used, the species chosen, the backing method used or the annealing parameters, which can lead to a defined morphology of those surfaces. The final detaching can be accompanied by a mechanical step.

Preferably, the detached surface has a surface roughness with RMS values of about 5 Å to 150 Å, especially 20 Å to 100 Å or 20 Å to 60 Å. This roughness allows a very good nucleation, providing a high-quality growth of the epitaxial layer on this surface.

The epitaxial layer comprises at least one of the following materials aluminum nitride, gallium aluminum nitride, silicon germanium, germanium, InGaN or gallium nitride. It has been shown that these layers grow especially well on the detached carrier surface.

The carrier structure comprises at least one of the following materials sapphire, silicon carbide, silicon, germanium, gallium arsenide, lithium gallate, indium phosphide, lithium aluminate, ZnO, aluminum nitride or gallium nitride. These materials can be easily detached and are appropriate for an epitaxial formation of a crystalline layer thereon. It is particularly favourable when the carrier structure is a composite structure, comprising at least a base wafer and a single crystalline top layer having the detached surface. In this microstructure, the crystalline top layer can accommodate very well strain caused by a lattice constant mismatch between the base wafer and the epitaxial layer.

In another embodiment of the invention, a first epitaxial layer is used as a buffer layer on which a second epitaxial layer is formed. Advantageously, the buffer layer, a lattice constant mismatch between the carrier substrate and the second epitaxial layer can be reduced, resulting in a high quality formation of the second epitaxial layer. Preferably, the second epitaxial layer comprises gallium nitride or relaxed silicon germanium. In one aspect of the invention the GeSi can be combined with other layers made from materials such as but not limited to strained silicon or germanium together forming the second epitaxial layer.

This method of the present invention produces a high-quality microstructure which is very attractive for many electronic and opto-electronic devices. The wide, direct energy band gap of the nearly-perfect gallium nitride which can be formed by the inventive method makes it suitable, for instance, for short wave length emitters and detectors. And its good thermal stability is advantageous for high temperature and high power electronics. Gallium nitride can be combined in an alloy with InGaN, and/or AlGaN, or be combined with layers of the materials together forming the second epitaxial layer.

Also in accordance with the present invention is a microstructure, preferably a heteroepitaxial microstructure, wherein the base substrate is produced by the detaching process described above. Surprisingly, the detached surface of the carrier substrate is very well-suited for depositing the epitaxial layer thereon with a high quality. The epitaxial layer can be formed on the detached carrier surface very easily and with a resulting low thickness, so that the microstructure can be produced with high efficiency.

Preferably, the carrier structure comprises sapphire, silicon carbide, silicon, gallium arsenide, lithium gallate, lithium aluminate, ZnO, aluminum nitride, germanium, indium phosphide, or gallium nitride. These materials can provide good detaching characteristics, leading to detached carrier surfaces on which the epitaxial layer can be formed with high quality. Some of the specified materials further have the advantage that they are compatible materials for a gallium nitride epitaxy, so that they can be effective for formation of epitaxial gallium nitride with a good crystallinity.

Preferably, the epitaxial layer comprises aluminum nitride, gallium aluminum nitride, InGaN or gallium nitride. These materials show very good growth characteristics on the detached carrier surface. More preferably, the epitaxial layer is gallium nitride. This material has very good electronic properties, so that the resulting microstructure can be used with ease in many electronic and opto-electronic devices.

In a further advantageous embodiment of the invention, the epitaxial layer is a buffer layer on which a second epitaxial layer is formed. Such a buffer layer is especially favourable for compensating for a lattice constant mismatch between the carrier structure and the second epitaxial layer.

BRIEF DESCRIPTION OF THE DRAWINGS

FIG. 1 to FIG. 10 show schematically typical process steps to produce an example of a microstructure according to the present invention, wherein:

FIG. 1 illustrates a carrier substrate of the present invention;

FIG. 2 illustrates a carrier substrate in which species have been implanted for detaching the substrate;

FIG. 3 illustrates a carrier substrate comprising a bonded wafer pair consisting of the substrates shown in FIGS. 1 and 2;

FIG. 4 illustrates the carrier substrate of FIG. 3 undergoing an annealing step;

FIG. 5 illustrates a detached part of the bonded wafer pair of FIG. 4, used as a carrier structure for the present invention;

FIG. 6 illustrates another detached part of the bonded wafer pair of FIG. 4, used as another carrier structure for the present invention;

FIG. 7 illustrates a microstructure of the present invention comprising the carrier structure of FIG. 5 and an epitaxial buffer layer thereon;

FIG. 8 illustrates a microstructure of the present invention comprising the carrier structure of FIG. 6 and an epitaxial buffer layer deposited thereon;

FIG. 9 illustrates the microstructure of FIG. 7 including a second epitaxial layer thereon; and FIG. 10 illustrates the microstructure of FIG. 8 including a second epitaxial layer thereon.

DETAILED DESCRIPTION OF THE PREFERRED EMBODIMENTS

The present invention will be more apparent from the following detailed description with reference to the accompanying figures.

Figure 1:
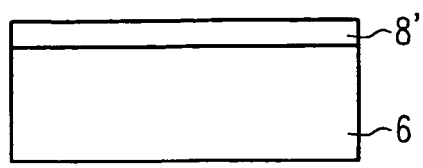
Figure 2:
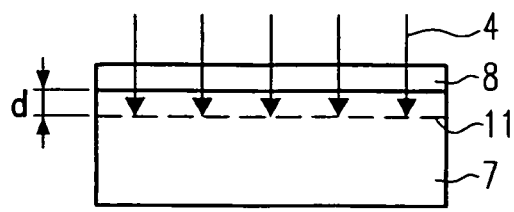

The present invention is directed to a method of fabricating a microstructure comprising the steps of detaching a base structure to provide a carrier substrate having a detached surface; and depositing at least one epitaxial layer on the carrier substrate. FIG. 1 illustrates a base structure used to form a carrier substrate of the present invention. The substrate of FIG. 1 comprises a wafer 6 of sapphire, silicon carbide, silicon, gallium arsenide, lithium gallate, lithium aluminate, zinc oxide, aluminum nitride or gallium nitride. In the embodiment shown, an oxide layer 8' is formed on the wafer 6. Alternatively, the oxide layer 8' can be omitted or can be of another insulating material. FIG. 2 shows another substrate used to form a carrier structure as applied in the present invention. The substrate of FIG. 2 consists of a wafer 7 having on top an oxide layer 8. In other embodiments the oxide layer 8 can be omitted or can be substituted with insulating material.

The base structure of the present invention is detached to form a carrier substrate. The detaching step includes implantation of species 4 such as hydrogen ions and/or rare gases, which are implanted through the oxide layer 8, and into wafer 7 to form an implanted carrier structure. The dose and/or energy of the implanted species may be adjusted so that a peak of concentration of the implanted species 4 is formed at a certain depth d on the wafer 7, thereby forming a weakened layer due to the ion implantation 11 at or near this depth d.

Figure 3:
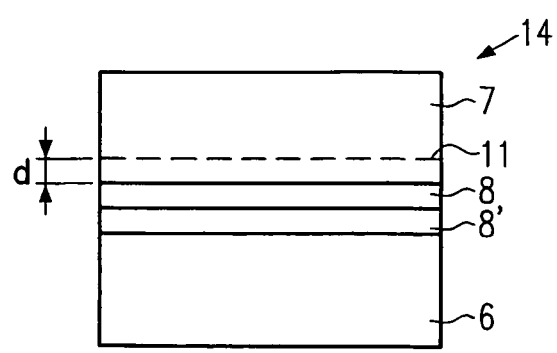

FIG. 3 shows a bonded wafer pair consisting of the substrates shown in FIGS. 1 and 2. The wafer pair is used as a base structure 14 to form a carrier substrate. In this embodiment, the base structure 14 consists of two wafers 6, 7 which are bonded together using insulator layers 8, 8' therebetween. In another embodiment of the present invention (not shown), the wafers 6, 7 are bonded directly so that at least one of the insulator layers 8, 8' can be omitted.

Figure 4:
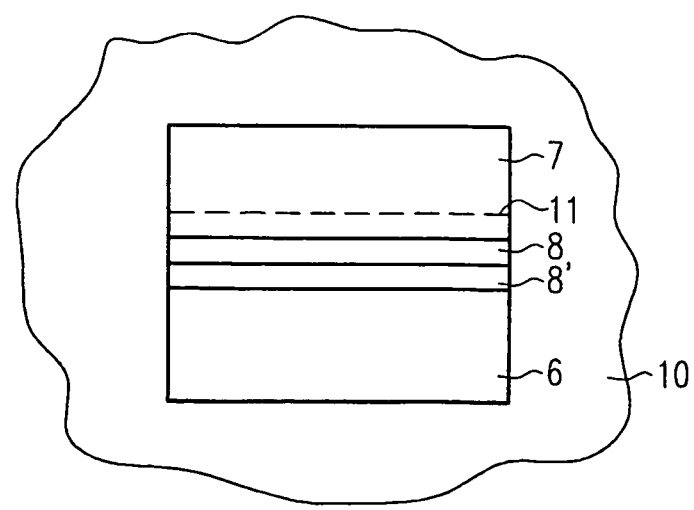

The detaching step may includes as shown in FIG. 4 an annealing step wherein the base structure 14 is annealed in a hot environment 10 such as a furnace or any equipment for rapid thermal annealing. The effect of temperature and annealing time weakens the implanted base structure 14 at the defect layer 11 introduced by atomic implantation which leads to detaching. By detaching along this region 11, one carrier structure 1 and a residual wafer part 7, which can also be used as a carrier structure for the present invention, are formed.

Figure 5:
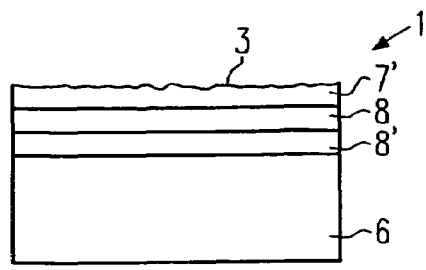

The detached carrier structure 1 as shown in FIG. 5 comprises the wafer 6, the insulator layers 8, 8' and a residual part 7' of the former wafer 7. The carrier substrate 1 has a relatively rough but homogeneous detaching surface 3. Typical RMS-values of roughness are about 5 Å to 150 Å, especially 20 Å to 100 Å or 20 Å to 60 Å. In comparison to the smooth surfaces of the substrates used for an epitaxial growth in the prior art, the surface 3 of the carrier substrate 1 may remains untreated after detaching. Thus, surface 3 does not require polishing or other treatments to reduce the surface roughness of the surface 3. However, if desired, such polishing steps are not excluded. Additionally, other further steps such as a cleaning the surface 3 after detaching are also within the scope of the invention. For example, if desired, the surface 3 may be treated after detaching to reduce the surface roughness. The surface treatment includes thermal oxidation and oxide removal, a chemical-mechanical polishing, etching by gas cluster ion beam or reactive ion etching, or a combination of these steps.

Figure 6:
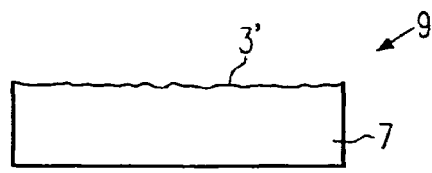

FIG. 6 shows the other carrier structure 9 formed by the detaching process of FIG. 4. The carrier structure 9 consists of the remaining part of the former wafer 7, having a surface 3' with an increased but homogeneous surface roughness.

In a further embodiment of the present invention, the roughness of the detached surface 3 can be further reduced by an additional step after detaching and before growth of a crystalline layer on the surface 3. This additional step can be oxidation and de-oxidation, chemical-mechanical polishing, etching by gas cluster, ion beam or reactive ion etching, HCL-smoothing or a combination of at least two of these steps. For example, the surface 3 can be treated with a thermal oxidation wherein the oxide is removed thereafter and the surface is finished with a final chemical-mechanical polishing step to a certain degree. In this way, the roughness of the surface 3 can be adjusted over a wide range of roughness values. Additionally, the power spectral distribution of the roughness can be shaped by the detaching parameters and/or subsequent treatment steps.

The roughness of the detaching surface 3 is relatively homogeneous, even after the detaching process. When the detached surface 3 is treated with at least one of the above-mentioned additional steps, the surface roughness can be tuned from a high roughness value of the just-detached surface to a low roughness value, wherein the homogeneity of the overall roughness of the surface 3 is maintained. After a thermal treatment, an ion treatment or a chemical-mechanical polishing, the carrier surface 3 has a roughness with RMS values of about 5 Å up to the roughness values of the detached surface 3 directly after detaching.

Figure 7:
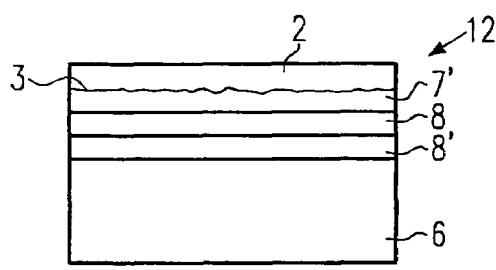

As shown in FIG. 7, the epitaxial layer 2, such as an aluminum nitride layer, grows particularly well on the rough but homogeneous surface 3, despite the increased surface roughness of the surface 3. Characteristics of the detached surface 3 are useful to grow the polycrystalline buffer layer 2 which forms a very good base to grow the monocrystalline second epitaxial layer 5 thereon.

A microstructure fabricated from the method of the invention is illustrated in FIG. 7. The microstructure 12 has an epitaxial layer 2 on the rough carrier surface 3 of the carrier substrate 1. The material of the epitaxial layer 2 includes aluminum nitride, gallium aluminum nitride or gallium nitride. The epitaxial layer 2 has a thickness of from about 20 nm to 500 nm and may be a buffer layer.

Figure 8:
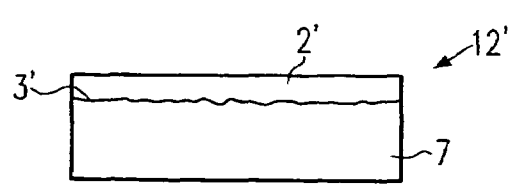

FIG. 8 shows the carrier structure 9 of FIG. 6, on which a polycrystalline layer 2' has been formed on the rough carrier surface 3'. The material of the epitaxial layer 2' comprises aluminum nitride, gallium aluminum nitride or gallium nitride. The epitaxial layer 2' has a thickness from 20 nm to 500 nm.

Further, a chemical-mechanical polishing step can be added, if necessary, between the growth of epitaxial layer 2 and epitaxial layer 5.

Figure 9:
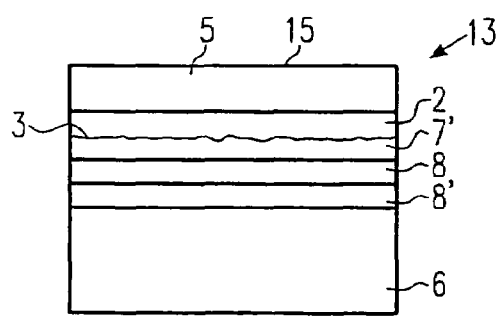

Also in accordance with the invention is a microstructure comprising first and second epitaxial layers. As illustrated in FIG. 9 microstructure 13 is formed by a growth of a monocrystalline second epitaxial layer 5 on the epitaxial layer 2 of the microstructure 12 of FIG. 7. The second epitaxial layer 5 comprises gallium nitride. This second epitaxial layer 5 has a very good crystallinity and a very low roughness of its surface 15. Root mean square (RMS) values of the second epitaxial layer 5 are typically between 0.5 and 4 Å.

Figure 10:
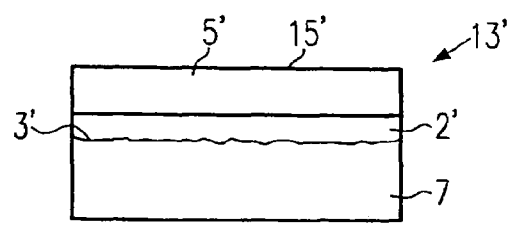

FIG. 10 also shows a microstructure 13' formed by the growth of a monocrystalline second epitaxial layer 5' on the epitaxial layer 2' of the microstructure 12' of FIG. 8. The second epitaxial layer 5' is gallium nitride and has a very good crystallinity and a very low level of roughness of its surface 15'. Root mean square (RMS) values of the second epitaxial layer 5' are typically between 0.5 and 4 Å.

With reference to FIG. 9, the second epitaxial layer of the microstructure 12 shown in FIG. 7 acts as a buffer layer for forming the monocrystalline second epitaxial layer 5 on that epitaxial layer 2. The epitaxial buffer layer 2 accommodates a mismatch of lattice constants between the residual part 7' of the carrier structure 1 and the grown second epitaxial layer 5. This method results in a very high crystal quality and a very smooth surface 15 of the second epitaxial layer 5.

Specifically, the resulting microstructure 13 preferably consists of an $\alpha$-$Al_2O_3$ or SiC base wafer 6, silicon dioxide insulator layers 8, 8' thereon, and a residual part 7' of a further $\alpha$-$Al_2O_3$ wafer 7. On the detached surface 3 of the layer 7', a thin aluminum nitride layer 2 is formed, and the layer thereon is a monocrystalline gallium nitride layer 5.

What is claimed is:

1. A method of fabricating a heteroepitaxial microstructure which comprises:
    detaching a layer from a base structure to provide a carrier substrate having a detached surface by implanting atomic species into the base structure to provide an implanted base structure that defines the layer; and annealing the implanted base structure to prepare the layer for detachment; and
    forming a microstructure on the detached surface of the carrier substrate by depositing a first epitaxial layer thereon.

2. The method of claim 1 which further comprises applying a mechanical stress to assist in detaching the layer.

3. The method of claim 1, wherein the detached surface of the carrier substrate has a surface roughness having a root mean square value of between about 5 Å to 150 Å.

4. A method of fabricating a heteroepitaxial microstructure which comprises:
    detaching a layer from a base structure to provide a carrier substrate having a detached surface; and
    forming a microstructure on the detached surface of the carrier substrate by depositing a first epitaxial layer thereon
    wherein the detached surface of the carrier substrate undergoes a treatment to reduce the surface roughness prior to forming the microstructure, the treatment being selected from the group consisting of: oxidation, polishing, etching, HCl-smoothing, or a combination thereof.

5. The method of claim 4, wherein the detached surface of the carrier substrate has a surface roughness having a root mean square value of about 5A after treatment.

6. The method of claim 1, wherein the detaching step provides a carrier substrate having a detached surface that is substantially homogenous.

7. The method of claim 1 wherein the carrier substrate comprises sapphire, silicon carbide, silicon, gallium arsenide, lithium gallate, indium phosphide, germanium, lithium aluminate, ZnO, aluminum nitride or gallium nitride.

8. The method of claim 1 wherein the first epitaxial layer is deposited to a thickness of from about 20 nm to about 500 nm.

9. The method of claim 1, wherein the first epitaxial layer comprises aluminum nitride, gallium aluminum nitride, silicon germanium, germanium, InGaN or gallium nitride.

10. A method of fabricating a heteroepitaxial microstructure which comprises:

detaching a layer from a base structure to provide a carrier substrate having a detached surface;

forming a microstructure on the detached surface of the carrier substrate by depositing a first epitaxial layer thereon; and depositing a second epitaxial layer on the carrier substrate prior to forming the microstructure.

11. The method of claim 10, wherein the second epitaxial layer has a surface roughness having a root mean square value of between about 0.5 and 4 Å.

12. The method of claim 10, wherein the second epitaxial layer is a buffer layer on which the first epitaxial layer is deposited to form the microstructure.

13. The method of claim 12, wherein the buffer layer comprises gallium nitride or relaxed GeSi.

* * * * *

UNITED STATES PATENT AND TRADEMARK OFFICE
CERTIFICATE OF CORRECTION

PATENT NO.        : 7,288,430 B2
APPLICATION NO.   : 11/165895
DATED             : October 30, 2007
INVENTOR(S)       : Faure et al.

It is certified that error appears in the above-identified patent and that said Letters Patent is hereby corrected as shown below:

Title Page:
Item (73) Assignee, change "Technolgoies" to -- Technologies --.
Item (63) Related U.S. Application Data, delete "Continuation of application No. 10/922,997, filed on Aug. 23, 2004, and a continuation-in-part of application No. 10/700,899, filed on Nov. 3, 2003, now Pat. No. 6,946,317" and insert
-- Continuation of 10/700,899, filed on Nov. 3, 2003, now Pat. No. 6,946,317, and a continuation-in-part of 10/922,997, filed on Aug. 23, 2004 --.

Column 6:
Line 64 (claim 5, line 3), change "5A" to -- 5Å --.

Signed and Sealed this

Twenty-sixth Day of February, 2008

JON W. DUDAS
*Director of the United States Patent and Trademark Office*